June 24, 1969 D. SEITZER ET AL 3,452,291

DIFFERENTIAL AMPLIFIER

Filed Aug. 15, 1966

INVENTORS
DIETER SEITZER
ROLF LUESCHER

BY Charles P. Boberg
ATTORNEY

United States Patent Office 3,452,291
Patented June 24, 1969

3,452,291

DIFFERENTIAL AMPLIFIER

Dieter Seitzer, Gattikon, and Rolf Luescher, Adliswil, Zurich, Switzerland, assignors to International Business Machines Corporation, Armonk, N.Y., a corporation of New York Filed Aug. 15, 1966, Ser. No. 572,588
Claims priority, application Switzerland, Nov. 26, 1965, 16,342/65
Int. Cl. H03f *1/00, 3/68*
U.S. Cl. 330—30 4 Claims

ABSTRACT OF THE DISCLOSURE

The differential amplifier disclosed herein is capable of accurately eliminating common-mode disturbances from differential-mode input signals consisting of pulses having very short rise times, and its design is well suited to mass fabrication. A single transistor is arranged so that it functions both as a common-base amplifier and a common-emitter amplifier having equal current gains and equal frequency bandwidths. To achieve this optimum relationship, the amplifier is provided with an emitter circuit having a resistor network so arranged that it effectively reduces the gain of the common-emitter amplifier to equal that of the common-base amplifier and effectively increases the frequency bandwidth of the common-emitter amplifier (through negative current feedback) to equal that of the common-base amplifier. The impedances of the input signal sources respectively are matched by the aforesaid resistor network in the emitter circuit and a suitable resistance in the base circuit. The design of the resistor network is predicated upon the solution of three simultaneous linear equations which express the optimum relationships of three unknown resistance values needed to achieve equal current gains, equal bandwidths and impedance matching properties in the common-emitter and common-base functions of the amplifier.

This invention relates to differential amplifiers which are capable of handling pulses having very short transistion intervals, in the order of nanoseconds.

A differential amplifier is a device that effectively subtracts one input signal from another input signal and furnishes an output signal which is the amplified difference of the two input signals. Such a device is employed to eliminate spurious "common-mode" signals (i.e., signals with identical waveforms, phases and amplitudes) which may be present in the two inputs. These unwanted signals, such as noise or hum, are mingled with the bona fide signal in one of the two inputs to the amplifier, while the other input (furnished by a "dummy" line or the like) may consist of the spurious signal alone, or in some instances it may contain the spurious signal plus an inverted "image" or complement of the bona fide signal, known as a "differential-mode" signal. The subtractive action of the differential amplifier effectively cancels the common-mode signals without adversely affecting the bona fide signal.

While common-mode signals can be satisfactorily eliminated insome instances by means of a transformer having opposed windings, this is not a satisfactory way of rejecting common-mode signals in systems of the kind contemplated by the present invention, where the signals to be rejected may closely resemble the genuine signals. In such instances it is preferred to employ a differential amplifier with at least one active element (such as a transistor) for performing the required amplifying functions. The present teachings are concerned with the problems that are involved in the design and operation of such amplifiers.

Where differential amplifiers are to be used in systems which are adapted to handle pulses with very short rise times, the design of such amplifiers should take into account a number of special requirements. First, for effective cancellation of common-mode signals, the current gains of the two inputs should be equal. Second, in order to handle pulses with short rise times, the amplifier should have a large gain bandwidth with respect to each of its inputs; that is, it should be capable of amplifying the high-frequency components of each signal input to the same extent that it amplifies the low-frequency components thereof. Third, to prevent unwanted signal reflections at the terminations of the input lines, the amplifier circuit should be provided with suitable input impedances for matching the respective impedances of the input lines, and it also should have a suitable output impedance to match the impedance of the output circuit which generally is much lower than the input impedances. Still other requirements must be met also, but the three already mentioned are considered to be especially significant.

Because of the stringent performance requirements mentioned above, prior differential amplifiers that are capable of dealing with signal transitions in the very low nanosecond range have tended to be costly and complex. Yet, if it should be desired to utilize differential amplifiers of this high quality on a large scale, as in data processing systems, for example, and particularly if it is desired to incorporate such amplifiers into batch-fabricated systems of large size, the economic factors then will dictate the necessity of using a differential amplifier design that is relatively cheap and simple. These contradictory requirements raise difficult design problems, and prior to the present invention, no completely satisfactory solution to these problems had been found. Prior differential amplifier designs have had to sacrifice either quality or economy, and in no instance have they been seriously considered for use in low-cost, high-performance, integrated circuitry.

A general object of the present invention is to provide a novel type of differential amplifier which fulfills all of the requirements stated hereinabove and which is well adapted for inclusion in low-cost, high-performance, integrated circuitry.

Another object is to provide a reliable differential amplifier circuit employing only one active element (e.g., a single transistor) for rejecting common-mode disturbances from pulsed input signals that have extremely short rise times (in the order of nanoseconds) without distorting or delaying the output signals.

A basic feature of the invention is a differential amplifier employing a single transistor which is adapted to function with respect to one of its inputs as a common-emitter amplifier having special means for providing negative current feedback and with respect to the other input as a modified common-base amplifier having an inherent negative current feedback. A uniquely designed resistor or resistor-capacitor network in the emitter circuit insures that there will be optimum feedback for wideband amplification and equal current gains for both inputs, as well as the requisite impedance match for the emitter input. A separate resistor in the base circuit provides an impedance match for the base input. This circuit performs satisfactorily as long as all cross-couplings between input lines are of a symmetrical nature.

In accordance with another feature of the invention, three amplifier circuits of the aforesaid type may be arranged as a double differential amplifier to eliminate common-mode signals from two pairs of input signals having like disturbance patterns, this type of amplifier being contemplated for use in those situations where a single amplifier is unable to accomplish a complete rejection of the spurious signals because of unsymmetrical couplings between the input lines and some of the disturbing signal sources.

In both of the above-described embodiments, common-mode signal rejection is accomplished with an irreducibly small number of transistors and other circuit elements under the particular circumstances of each case, without sacrificing any performance quality, thereby providing for the first time, a differential amplifier design that can reasonably be considered for inclusion in modern integrated circuitry.

The foregoing and other objects, features and advantages of the invention will be apparent from the following more particular description of preferred embodiments of the invention, as illustrated in the accompanying drawing, wherein.

Figure 1:
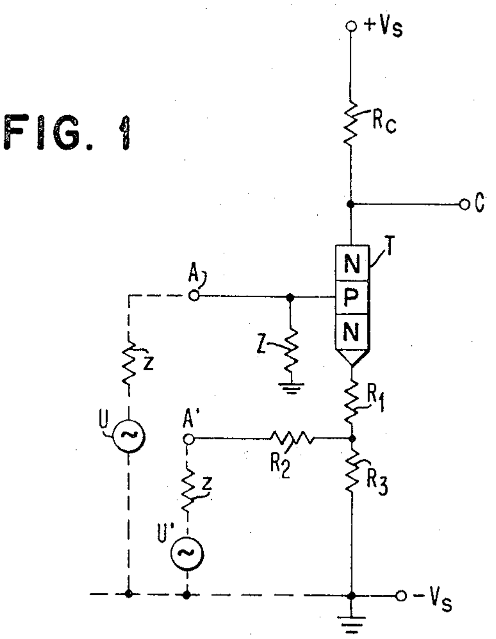
FIG. 1 is a circuit diagram of a simple and inexpensive differential amplifier embodying the basic features of the invention.

The differential amplifier shown in FIG. 1 contains a single active element, disclosed herein as a three-electrode junction transistor T. Two input terminals A and A' receive inputs from signal sources U and U', respectively, each of which sources has an impedance $z$ that should be matched by a like input impedance of the amplifier for optimum results. If the amplifier is employed, for example, in the data storage apparatus or "memory" of a data processing system, the source U may be one of the sense lines of a memory array having characteristic line impedance $z$; while the source U' may be a dummy sense line also having a characteristic line impedance $z$. The source U furnishes a composite signal comprising the true signal which is to be amplified plus an unwanted signal or disturbance, such as capacitively-coupled noise, for example. The source U' furnishes a signal known as a "common-mode" signal which is in all respects identical with the unwanted component of the signal furnished by the source U, and in some instances it may include also an inverted image or complement of the true signal, known as a "different-mode" signal. All of the various signal components mentioned above may have extremely short transition intervals, in the order of a few nanoseconds. Moreover, portions of the spurious signals may differ only slightly from the genuine signals, and the discrimination must be based upon these slight differences. It is desired that both of the input signals be faithfully amplified within the differential amplifier circuitry but that the spurious common-mode portions of these signals be prevented from appearing in the output signal of the amplifier.

The base of transistor T is connected to terminal A, which receives the input signal from source U. Also connected to the base of transistor T is one end of a resistor Z, the other end of which is grounded. The purpose of resistor Z is to provide the amplifier with an input impedance (as viewed from the terminal A) which matches the impedance $z$ of source U. Terminal A', to which the input signal from source U' is applied, is connected through a resistor $R_2$ to the junction of two resistors $R_1$ and $R_3$ which are connected in series. The opposite end of $R_1$ is connected to the emitter of transistor T, while the opposite end of $R_3$ is connected to ground and the negative side of the power supply $V_s$. The resistor network $R_1$–$R_2$–$R_3$ in the emitter circuit serves several important functions, which will be explained in detail presently. The positive side of $V_s$ is connected through the external collector load resistor $R_c$ to the collector of transistor T. The output signal developed across the load resistor $R_c$ appears at the output terminal C, which is connected to the collector of transistor T. Although FIG. 1 shows a transistor of the NPN type, the amplifier is not limited to this type of transistor but could operate equally well with a transistor of the PNP type, using a reversed polarity of the power supply.

In order to provide a differential amplifier which can reliably handle steep-sided pulses (i.e., pulses with very short transition intervals) using the irreducible minimum of circuitry, there are several conditions to be fulfilled. Some of these are quite obvious. For instance, the transistor T must be of a high-performance type, and its operating point must be chosen in the linear part of its characteristic. In any case, the drive has to be kept within such limits that saturation or cut-off never occurs. This requirement should be met even where the amplifier is required to handle small signals only. Secondly, the value of the collector load resistor $R_c$ must be small in comparison with the internal collector resistance of transistor T. This enhances the broad-band gain properties of the amplifier by causing the transistor T to operate under nearly short-circuit conditions, which means that the collector current will show the same behavior as though the collector load were connected to ground directly through the power supply. Furthermore, it is contemplated that the amplifier generally will feed a low-resistance load in practice.

Having met the above-stated preliminary conditions, one then has to decide which of the basic types of transistor amplifier circuitry should be chosen for optimum results, particularly with regard to achieving optimum broad-band properties. As is well known, a common-base (or grounded-base) amplifier has good broad-band properties because its operation inherently involves negative current feedback, which tends to increase the gain bandwidth. Hence, with respect to one of its inputs, it is desirable that the amplifier function essentially as though it were of the common-base type. With respect to its other input, the amplifier cannot behave as a grounded-base amplifier, but it can be made to function as a common-emitter (or a grounded-emitter) amplifier in which there occurs a certain amount of negative current feedback by virtue of an external resistance incorporated in the emitter-to-ground circuit. The elements making up the grounded-emitter circuit must be so chosen that this circuit is able to meet the same bandwidth requirements as the grounded-base circuit does. Further attention will be given to this aspect of the matter presently.

For cancellation of common-mode signals, it is necessary, of course, that identical input signals should produce output signals that are 180° out of phase with each other. Obviously the circuitry of FIG. 1 meets this condition. Signals from input terminal A will tend to produce amplified signals at output terminal C which are shifted in phase by 180°. However, signals from input terminal A' will tend to produce amplified output signals of the same phase, which subtract from the first-mentioned output signals.

Fulfillment of the stated objective of this invention entails some further considerations which are quite significant. Thus, it is important that the differential amplifier exhibit equal current gains and large gain bandwidths for both of its inputs; moreover, it is important that the respective input impedances of the amplifier match the source impedances. By judiciously selecting the values of the resistors $R_1$, $R_2$, $R_3$ and Z, FIG. 1, in accordance with the principles stated below, all of these desired ends can be attained in a manner that avoids the complexity and expense of prior differential amplifier designs having comparable high-performance capabilities.

The condition that there be equal current gains between the signal output and the two signal inputs may be stated mathematically as follows:

$$V=f(R_1, R_2, R_3, R_{ei}, z)=V'=f(R_1, R_2, R_3, R_{ei}, z) \quad (1)$$

where V and V' respectively signify the current gains from A to C and from A' to C, respectively, and $f$ represents a known linear mathematical function of the values designated within the parentheses. $R_{ei}$ is the input resistance of the emitter of transistor T, viewed from the outside, which depends upon the type of transistor used and the operating conditions chosen. The value of $R_{ei}$ is assumed to be known beforehand. The internal resistance $z$ of each signal source U or U′ likewise is considered to be known. The effect of the collect load $R_c$, FIG. 1, is disregarded, since it plays an insignificant part in the particular determination.

With respect to its input at terminal A′, the amplifier has an ample amount of gain bandwidth because it functions essentially as a common-base amplifier, which inherently has good bandwidth properties. With respect to its input at terminal A, the amplifier functions as a common-emitter amplifier with a certain amount of negative current feedback, as determined by the external emitter resistance $R_{ea}$ which is a function of the resistance values $R_1$, $R_2$, $R_3$ and $z$, expressed mathematically as follows:

$$R_{ea}=R_1+\frac{R_3(R_2+z)}{R_3+R_2+z} \qquad (2)$$

The value of $R_{ea}$ is chosen in accordance with the common-emitter gain bandwidth desired at terminal A, bearing in mind that the same should be commensurate with the common-base gain bandwidth already available at the other input terminal A′. Incidentally, $R_{ea}$ should not be confused with $R_{ei}$, mentioned hereinabove. The value of $R_{ea}$ is determined entirely by parameters external to the transistor T, whereas the value of $R_{ei}$ is determined by the internal parameters of the transistor T and the particular conditions under which it is operated.

The final requirement is that there be a perfect match between each of the input impedances of the amplifier and the impedance of the respective signal source. For the input at terminal A, this requirement is met simply by matching the base input impedance of transistor T with the characteristic impedance $z$ of signal source U. Inasmuch as the base input resistance of a transistor is ordinarily very much higher than $z$, the effective base input resistance is lowered to the value of $z$ in this instance by connecting the resistor Z between the base of transistor T and ground. The resistance of Z will be substantially equal to $z$, except in those cases where the source impedance $z$ assumes the same order of magnitude as the base input resistance of the transistor. In the present instance, however, it is assumed that $Z=z$.

For matching the impedance $z$ of the signal source U′ with the input impedance as seen at terminal A′, the resistance values $R_1$, $R_2$ and $R_3$ are so chosen in relation to each other and to the emitter input resistance $R_{ei}$ (defined above) that the following condition is fulfilled:

$$z=R_2+\frac{R_3(R_1+R_{ei})}{R_3+R_1+R_{ei}} \qquad (3)$$

The Formulae 1, 2 and 3 set forth hereinabove represent three simultaneous linear equations involving three unknown factors $R_1$, $R_2$ and $R_3$. These simultaneous equations can readily be solved for the respective values of $R_1$, $R_2$ and $R_3$, thereby completely defining all parameters of the amplifier circuit shown in FIG. 1.

A differential amplifier has been built and successfully operated in accordance with the principles taught hereinabove. The operating conditions and results of this test are set forth below:

| | |
|---|---|
| Bandwidth | Approximately 100 megacycles. |
| Impedance of each signal source ($z$) | Approximately 50 ohms, |
| Gain figure | 5 to 10. |
| Common-mode rejection with a pulse rise time of 3 nanoseconds | Approximately 20 decibels on pulse slopes and more than 40 decibels on pulse tops. |

The foregoing values are typical and have been obtained without difficulty. The differential amplifier shown in FIG. 1 handles push-pull signals in the order of 10 millivolts and reduces common-mode signals of 1 volt to approximately the same level. The circuitry is very simple, and the elements used therein are not critical. Due to this simple structure, the device is particularly suited for production as an integrated-circuit element. The high quality of its performance combined with its low cost, as well as its suitability for integration, makes this differential amplifier circuitry known thus far in the art.

Figure 2:
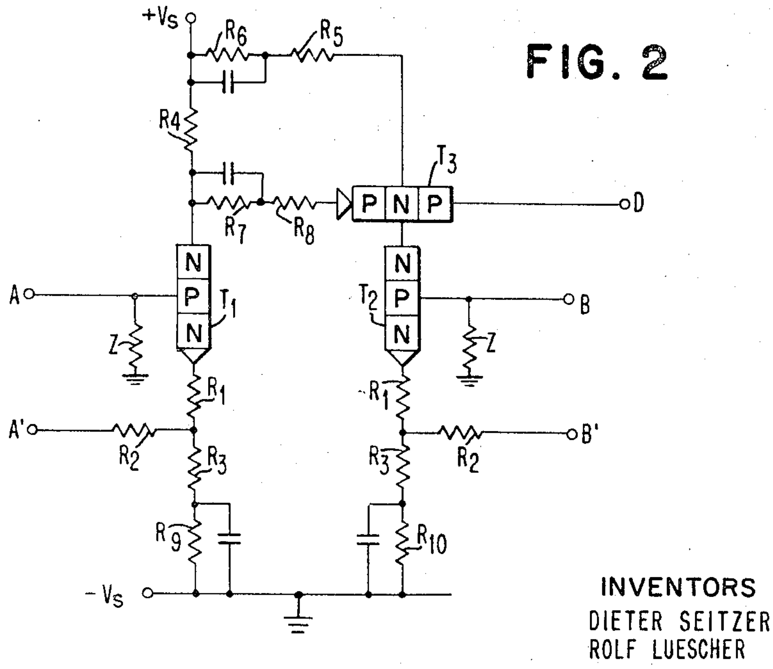
FIG. 2 is a circuit diagram of a double differential amplifier embodying certain additional features of the invention which are designed to deal with problems caused by unsymmetrical cross-couplings between input lines.

The reliability of the circuit shown in FIG. 1 is premised upon the assumption that all of the unwanted disturbances which are coupled into the input line leading from source U to input terminal A are likewise coupled in an equal fashion into the other input line leading from source U′ to input terminal A′. However, these two effects are not necessarily equal in practice, due to the possibility that there may be an adjacent signal source which is cross-coupled in an unsymmetrical manner with the two lines just mentioned. In order to overcome this unbalancing effect, a double differential amplifier as shown in FIG. 2 may be employed. In this device B and B′ are input terminals which are unsymmetrically coupled to the aforesaid disturbing signal source in the same manner that the input terminals A and A′ are. The output signal at terminal D then is the result of a double subtraction operation which eliminates the unsymmetrical common-mode signal components.

The circuit of FIG. 2 is a combination of three simple circuits each essentially identical with or derived from the circuit shown in FIG. 1. The three stages are directly coupled with each other so that even for this circuit the number of elements is kept at a bare minimum. The resistors $R_6$, $R_7$, $R_9$ and $R_{10}$, each bypassed by a capacitor, serve the sole purpose of providing suitable D.C. biases to determine the appropriate operating points for the three transistors $T_1$, $T_2$ and $T_3$. They do not influence the A.C. behavior of the whole circuit. For producing one output signal at D there are two pairs of inputs A, A′ and B, B′. Except for the external collector load resistor, the respective circuits of $T_1$ and $T_2$ and their associated elements are identical with the circuit of FIG. 1. The collector outputs of $T_1$ and $T_2$ are directly connected to the output amplifier stage of transistor $T_3$. From the collector of $T_3$ there is a lead to terminal D, which acts as a signal output for the double differential amplifier. In FIG. 2, the output transistor $T_3$ is shown as a PNP-type transistor because this makes it easy to have output D at a D.C. ground level. Where this is not advantageous, an NPN-type transistor may be used with equal results.

The strict requirement that there be a perfect match of the respective signal source impedances to the input impedances at terminals A, A′ and B, B′ of transistors $T_1$ and $T_2$, respectively, does not apply with respect to transistor $T_3$. This is due to the fact that between $T_3$ and $T_1$, or between $T_3$ and $T_2$, there are no reflections to disturb the correct signal transmission. The impedance match at this point, therefore, is of only minor importance. The choice of element values for the third stage can be made along the lines taught in well-known scientific texts relating to transistor pulse-amplifying circuitry. However, the gain for the collector signal of transistor $T_1$ must equal the gain for the collector signal of transistor $T_2$, as before. From the collector lead of $T_1$ a collector load $R_4$ is connected to the positive terminal of power supply $V_s$. The collector of $T_1$ also is connected through the serial combination of resistors $R_7$ and $R_8$ to the emitter of transistor $T_3$. The collector of $T_2$, however, is directly in contact with the base of $T_3$, from whence a serial combination of resistors $R_5$ and $R_6$ leads to the positive terminal of the power supply $V_s$. As previously mentioned, each of the resistors $R_6$ and $R_7$ is appropriately bypassed by a capacitor which transmits A.C. signals, and it provides a D.C. bias for determining the operating point of $T_3$.

The condition of equal gain for the respective output signals of $T_1$ and $T_2$ is met when:

$$R_5=\alpha\cdot R_4$$

where $\alpha$ is the current amplification factor of transistor $T_3$ in a grounded-base circuit. As seen from FIG. 2 the collector current of $T_1$ and also the emitter current of $T_3$ are flowing through resistor $R_4$. The collector current of $T_2$ and the base current of $T_3$, however, flow through resistor $R_5$. Resistor $R_8$ provides negative current feedback for the third stage ($T_3$) of the double differential amplifier.

The number of elements included in the circuit of FIG. 2 is restricted to the essentials. This device also has been tested under working conditions with similar good results. The choice of values for the elements is not critical, and they can easily be calculated. Due to its simplicity this circuit can also be produced in integrated form. According to known technical publications on amplifier circuits, a prior double differential amplifier of similar capability would require at least six transistors plus a number of other circuit elements not utilized herein. By using the circuits of this invention for single or multiple difference amplification, the expenditure for circuitry can be cut down to approximately one-half that of known circuits having comparable performance.

What is claimed is:

1. A differential amplifier having first and second input terminals (A and A′) and operable from a voltage supply for amplifying the difference between input signals respectively applied to said terminals by first and second signal sources (U and U′), each source having a known impedance ($z$) and connected on one side thereof to a common terminal ($-V_s$) of said voltage supply, said amplifier comprising:

a transistor (T) having emitter, collector and base electrodes;

base circuit means connecting said base to said first input terminal and including means (Z) affording an adequate impedance between said first input terminal and said common terminal to match the impedance of said first signal source;

collector circuit means including load means ($R_c$) for connecting said collector to another terminal ($+V_s$) of said voltage supply and also including an output terminal (C) at which the output signal of the amplifier is manifested;

and an emitter circuit network connecting said emitter to said second input terminal and to the common terminal of said voltage supply, said emitter circuit network including first, second, and third resistors (R1, R2 and R3), each having one end thereof connected to one end of each of the other two resistors; the other end of said first resistor (R1) being connected to said emitter; the other end of said second resistor (R2) being connected to said second input terminal; and the other end of said third resistor (R3) being effectively connected to said common terminal said resistors in combination providing the following constitutent elements of said emitter circuit network:

means affording adequate impedance between said second input terminal and said common terminal to match the impedance of said second signal source, gain-determining means for providing a predetermined current gain between the first input signal and the output signal substantially equal to the current gain between the second input signal and the output signal, and bandwidth-determining means for providing negative current feedback to determine the limits of the frequency band within which said predetermined current gain is effective.

2. A multi-stage differential amplifier comprising:

a first stage comprising a differential amplifier of the kind set forth in claim 1 which is responsive to a first pair of input signal sources;

a second stage comprising a differential amplifier of the kind set forth in claim 1 which is responsive to a second pair of input signal sources;

and a third stage comprising a differential amplifier operable from said voltage supply for amplifying the difference between the respective output signals of said first and second stages.

3. A multi-stage differential amplifier as set forth in claim 2 wherein said third stage includes;

a third transistor (T3) having emitter, collector and base electrodes;

an output terminal (D) connected to the collector of said third transistor;

base circuit means connecting the base of said third transistor to the output terminal of said second stage and to one terminal of said voltage supply, including a gain-determining element (R5);

and an emitter circuit network connecting the emitter of said third transistor to the output of said first stage and to one terminal of said voltage supply, said last-mentioned network including resistors (R4 and R8) arranged to provide the following elements:

gain-determining means effective in conjunction with said gain-determining element to provide equal current gains for the signals respectively supplied to the base and emitter of said third transistor, and bandwith-determining means for determining the negative current feedback and therefore the limits of the frequency band within which such equal current gains are effective.

4. A differential amplifier as set forth in claim 3 wherein said third transistor is of a conductivity type opposite to the conductivity type of the transistor in each of said first and second stages.

References Cited

UNITED STATES PATENTS

| | | | |
|---|---|---|---|
| 3,277,312 | 10/1966 | Harris | 307—235 |
| 3,299,282 | 1/1967 | Eriksson et al. | 307—235 |
| 3,299,287 | 1/1967 | Staeudle | 307—235 |
| 3,372,234 | 3/1968 | Bowsher et al. | 307—235 X |

OTHER REFERENCES

Text—Vacuum Tube Amplifiers by Vallegy and Wellman, MIT Radiation Lab series, vol. 18, pp. 441, 330–69.

NATHAN KAUFMAN, *Primary Examiner.*

U.S. Cl. X.R.

330—69